United States Patent [19]

Pichot et al.

[11] Patent Number: 4,745,337
[45] Date of Patent: May 17, 1988

[54] METHOD AND DEVICE FOR EXCITING A PLASMA USING MICROWAVES AT THE ELECTRONIC CYCLOTRONIC RESONANCE

[75] Inventors: Michel Pichot, Grenoble; Jacques Pelletier, Saint Martin D'Heres; Yves Arnal, Poizat, all of France

[73] Assignees: Centre National d'Etudes des Telecommunications; Centre National De La Recherche Scientifique, both of Paris, France

[21] Appl. No.: 871,107

[22] Filed: Jun. 5, 1986

[30] Foreign Application Priority Data

Jun. 7, 1985 [FR] France .................. 8508836

[51] Int. Cl.⁴ .................. H01J 27/00; B23K 9/00
[52] U.S. Cl. .................. 315/111.41; 315/111.21; 315/111.71; 315/111.81; 156/345; 219/121 PD; 219/121 PG; 313/156
[58] Field of Search .................. 315/111.21, 111.41, 315/111.71, 111.81; 219/121 PD, 121 PG; 156/345; 313/156, 161, 231.31

[56] References Cited

U.S. PATENT DOCUMENTS

4,543,465  9/1985  Sakudo .................. 315/111.41

FOREIGN PATENT DOCUMENTS

0028303  5/1981  European Pat. Off. ....... 315/111.21
0129490  6/1984  European Pat. Off. ..
2551302 10/1983  France .
0142497  6/1979  Japan .................. 315/111.71

OTHER PUBLICATIONS

Arnal et al, "Plasma Etching in Magnetic Multipole Microwave Discharge, *Applied Physics Letters*, 1984, pp. 132–134.
Sakudo et al, "Microwave Ion Source," *Review of Sci. Instr.*, vol. 48, #7, 7/1977, pp. 134–136.

*Primary Examiner*—David K. Moore
*Assistant Examiner*—Michael J. Nickerson
*Attorney, Agent, or Firm*—Weingarten, Schurgin, Gagnebin & Hayes

[57] ABSTRACT

Method and device for exciting a plasma using microwaves at the electronic cyclotronic resonance.

The device for exciting a gaseous medium by microwaves comprises at least a co-axial structure for introducing the microwave power inside a multipolar confinement structure and at least one antenna coupled to said co-axial structure for the localized introduction of the microwave energy inside said multipolar magnetic confinement structure which comprises a set of permanent magnets creating a network of surfaces having a constant magnetic field and presenting locally an intensity which corresponds to the electronic cyclotronic resonance, and said antenna being positioned on said network of surfaces of constant magnetic field in an area of intensity corresponding to the electronic cyclotronic resonance.

The invention finds an application in the creation of a homogenous, isotropic plasma of large volume and high density, which is free of fields in the area of use.

14 Claims, 3 Drawing Sheets

METHOD AND DEVICE FOR EXCITING A PLASMA USING MICROWAVES AT THE ELECTRONIC CYCLOTRONIC RESONANCE

BACKGROUND AND FIELD OF THE INVENTION

The present invention relates to a method and device for exciting a plasma using microwaves, at the electronic cyclotronic resonance, the object being to produce a homogeneous plasma of large volume and high density.

The production of plasma can be used in a varied number of applications such as surface treatments or the production of ion beams.

Most of the plasma-exciting techniques applied in laboratories and for industrial purposes use continuous discharges or radio-frequency discharges of which the coupling is generally capacitive.

Various excitation devices are known for the very specific field of microwaves.

A first type of excitation device uses a coupling inside a microwave cavity, this producing plasmas at relatively high pressure ($10^{-1}$ to $10^2$ Pa) and confined in volumes of small dimensions.

In a second type of excitation device, the coupling is performed by surface wave (surfatron, surfaguide). In this case, the accessible range of pressure is wide ($10^{-1}$ to some $10^5$ Pa.). In this case generally, columns of plasma of small diameter are obtained.

Excitation of the plasma may also be obtained by coupling in magnetic field at the electronic cyclotronic resonance frequency. In this case, the resonance is obtained for a magnetic field B and an excitation frequency f, linked by the relation:

$$B = \frac{2\pi m}{e} \times f \quad (I)$$

wherein m and e are the mass and the charge of the electron. By way of example, for a frequency of 2.45 GHz, it is necessary to use a magnetic field of 875 Gauss in order to obtain the resonance.

With this particular type of excitation, plasmas can be obtained at very low pressure, around $10^{-2}$ Pa.

An excitation of plasma has also been achieved with a "Lisitano" type antenna. The plasma can be ignited if the antenna is immersed in a uniform magnetic field large enough to obtain the electronic cyclotronic resonance.

The different excitation devices indicated hereinabove all present certain problems of adaptation for certain applications, especially when it is necessary to have large volumes of homogeneous plasmas of high density in a wide range of pressure. Such requirements exist in particular, for the treatments of surfaces by plasma, in metallurgy as well as in microelectronics, for depositing, engraving or excitation operations.

It has been proposed, for example in French Patent Application No. 83-10116, to carry out a multipole magnetic confinement and to use a localized source of microwaves in order to obtain a plasma with a good homogeneity. Such a device however requires that the average free path of the ions be about equal to if not greater in size than the plasma. This imposes to have to work at low pressure, about $10^{-1}$ to $10^{-3}$ Pa. Therefore the electronic cyclotronic resonance is used in this case to excite such plasmas. But there is one important restriction which is the density of plasma which can be obtained with such a device. Indeed, an increase in the plasma density implies, either an increase in the surface of the microwave source, or an increase in the number of sources.

These two solutions however come up against the problem of producing a large volume of magnetic field by using coils. Besides the cost of the power supply, there is a restriction in that the presence of high stray fields, away from the coil, make the plasma anisotropic. It is, moreover, necessary to introduce the microwave electric power in vacuum through windows in dielectric materials, such as quartz or alumina, which raises technological problems in certain applications. Finally, the presence of a residual microwave power in the plasma can prove to be a problem with certain techniques such as engraving with resin masks.

It is not possible to increase the density of the source by increasing the microwave frequency. Indeed, in this case, the magnetic field necessary to the resonance is also greatly increased, which increases the problems mentioned hereinabove. In addition, at the high frequencies in dominant mode, the gain is reduced, as is the cross-sectional surface of the waveguide.

SUMMARY OF THE INVENTION

It is the object of the present invention to overcome the aforesaid disadvantages and to permit the production of a plasma, with a microwave excitation, in conditions such that the plasma is a homogeneous isotropic plasma, of large volume, low pressure, and high density, namely a plasma free of intermittent electromagnetic fields and static magnetic fields in the area of use, and that said plasma presents an independence between the parameters of generation of the plasma and those of its interaction with the substrate to be treated.

It is therefore the object of the invention to create a central volume of plasma which is devoid of magnetic field and of microwave energy in volume.

The invention proposes to this effect a device for exciting a plasma by microwaves at the electronic cyclotronic resonance, which device comprises at least one permanent magnet creating a surface of constant magnetic field and of intensity corresponding to the electronic cyclotronic resonance, and at least one antenna joined to a co-axial structure for applying energy in the microwave range, said structure being positioned on said surface of constant magnetic field and of intensity corresponding to the electronic cyclotronic resonance.

Advantageously, the permanent magnet is constituted by a magnetized bar and the antenna is positioned at the intersection of the median plane of said bar with the surface having a constant magnetic field and an intensity corresponding to the electronic cyclotronic resonance.

The co-axial structure may be constituted by a co-axial cable.

The excitation device may further comprise means of causing a flow of cooling fluid along the antenna.

Inlet means for the admission of a ionizing gas may also be provided immediately close to the antenna, said means being perforated with orifices all along said antenna.

The invention more particularly relates to a device for producing a very homogeneous plasma of high density and large volume, which device comprises a tight enclosure connected to a pumping circuit and to a circuit for introducing a gaseous medium with a view to keeping up a predetermined pressure inside the enclosure, a multipolar magnetic confinement structure, and a device for exciting the gaseous medium by means of microwaves at the electronic cyclotronic resonance, wherein said microwaves excitation device comprises at least one co-axial structure for introducing the microwave power inside the multipolar confinement structure and at least one antenna coupled to the co-axial structure for the localized introduction of the microwave energy, the multipolar magnetic confinement structure comprising a set of permanent magnets creating a network of surfaces having a constant magnetic field and presenting locally an intensity which corresponds to the electronic cyclotronic resonance, and said antenna being positioned on said network of surfaces of constant magnetic field in an area of intensity corresponding to the electronic cyclotronic resonance.

In this case, the multipolar permanent type of magnetic field is used both for confining and for creating the plasma.

According to one particular embodiment of the invention, the multipolar magnetic confinement structure is constituted by a multipolar cage formed by bars of permanent magnetic type, which bars extend in parallel and offer, in the direction of the volume defined by the confinement structure, a face of successively different polarities. The antenna is placed in parallel to a magnetic bar, at the intersection of the median plane of the bar with the surface of a constant magnetic field, of intensity corresponding to the electronic cyclotronic resonance.

The microwave excitation device may comprise a plurality of antennas distributed along the multipolar magnetic confinement structure.

Said multipolar magnetic confinement structure forming cage, may be operationally coupled to a structure ensuring the closure of the magnetic circuit outside the case, said closing structure may be provided with permanent magnets or with a highly permeable material. Such structure may be partly or totally situated inside or outside the tight enclosure.

According to one special embodiment of the invention, at least one tube for introducing the gas to be ionized is situated immediately close to each antenna and in parallel thereto, and each tube is provided with a set of orifices distributed throughout its length and having a small diameter compared with the diameter of the tube.

A further object of the invention is to propose a process for exciting a plasma using microwave energy at the electronic cyclotronic resonance, with a view to producing a homogeneous and isotropic plasma of large volume and high density, which process consists in producing locally, by means of a multipolar magnetic structure, a magnetic field of sufficient intensity for the electronic cyclotronic resonance, and in introducing, the microwaves energy in localized manner via antennas, in the zone of magnetic fields permitting an electronic cyclotronic resonance.

BRIEF DESCRIPTION OF THE DRAWINGS

The invention will be more readily understood on reading the following description with reference to the accompanying drawings in which.

DETAILED DESCRIPTION OF THE INVENTION

Figure 1:
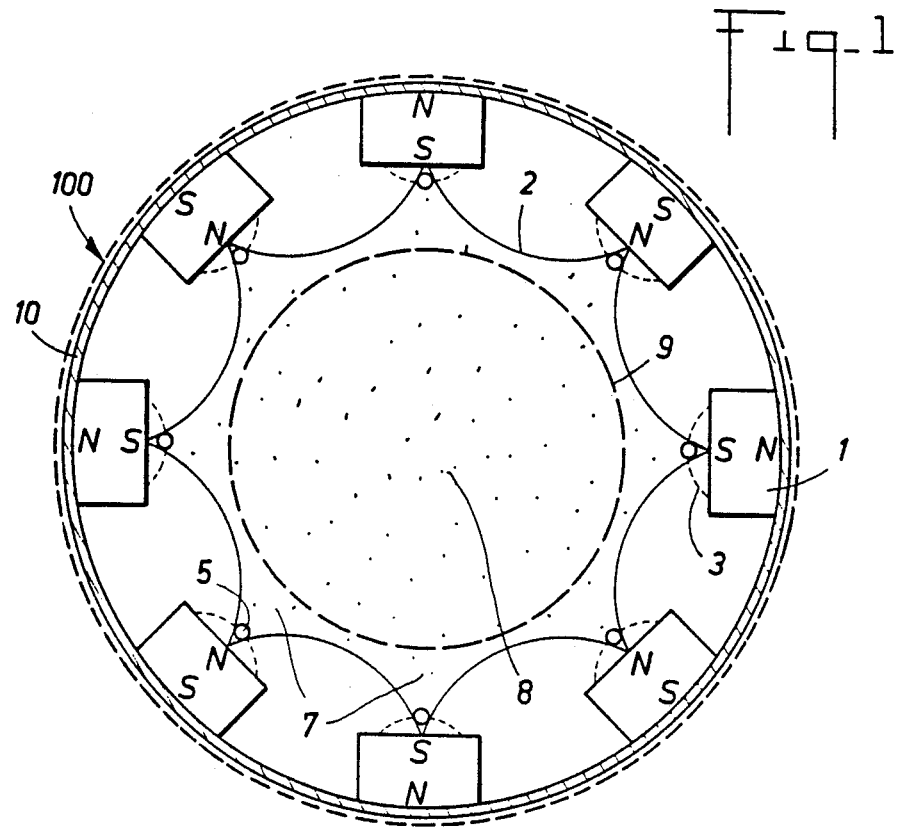
FIG. 1 is a diagrammatical cross-section following a radial plane of a plasma-producing device according to the invention.
Figure 5:
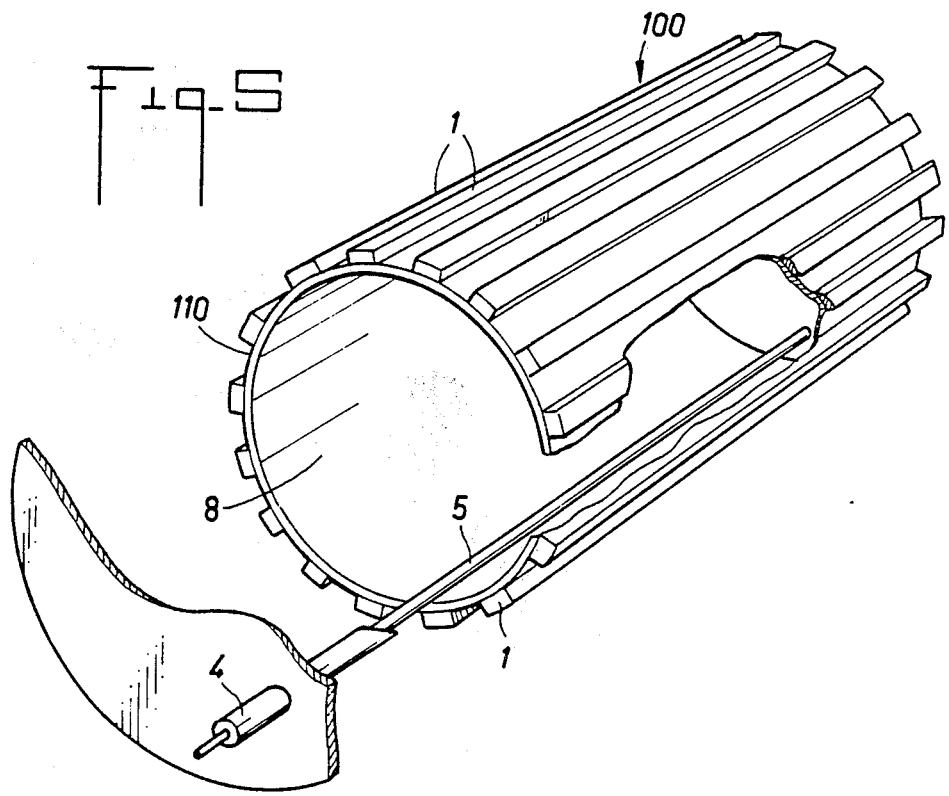
Figure 4:
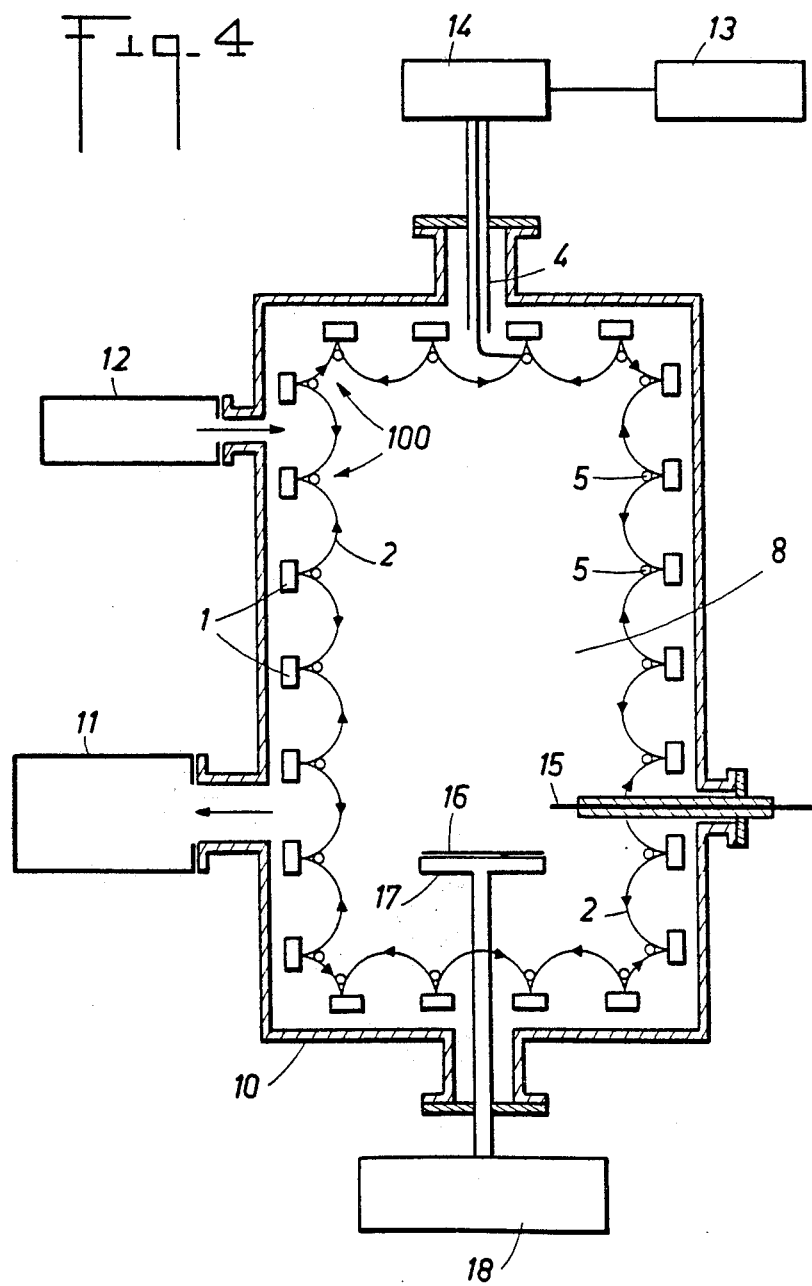

Referring first to FIGS. 1, 4 and 5, these show a miltipolar magnetic structure 100 which forms a cage and is constituted of permanent magnets 1 confining the plasma inside a central area 8. Said mutlipolar magnetic structure 100 is so designed that the magnetic field is of sufficiently great an intensity to obtain locally the electronic cyclotronic resonance. For example, for an exciting frequency of 2.45 GHz the intensity of the magnetic field must be 875 Gauss and for an exciting field of 10 GHz the intensity of the magnetic field must be 3,500 Gauss. The microwave energy is introduced in the multipolar cage 100, not in the whole volume, but in localized manner into the magnetic field area permitting the resonance, by way of at least one antenna 5 situated close to the confinement surface 2.

By way of example, FIGS. 1, 4 and 5, show a multipolar confinement structure 100 which comprises permanent magnets constituted by parallel bars 1 successively presenting alternate polarities to the plasma, as indicated in FIG. 1, in order to constitute a closed magnetic surface. The plasma is thus confined in area 8, inside the festooned lines of magnetic field 2 which are illustrated diagrammatically in FIGS. 1 and 4. Such a structure 100 is further characterized by a network of surfaces of constant magnetic fields, with among them, a surface 3 of intensity corresponding to the eletronic cyclotronic resonance. Said surface 3 covers each magnetized wall, as illustrated in dotted lines in FIG. 1, as well as in FIGS. 3a and 3b.

The electronic cyclotronic resonance necessitates the use of permanent magnets 1 which deliver a sufficient magnetic field intensity at a suitable distance, from the magnetic poles, namely about a few millimeters. It is possible to use, for example magnets of baryum ferrite ($Ba_1O$, $6\ Fe_2O_3$) or strontium ferrite, or magnets of samarium cobalt ($SmCo_5$).

Figure 2:
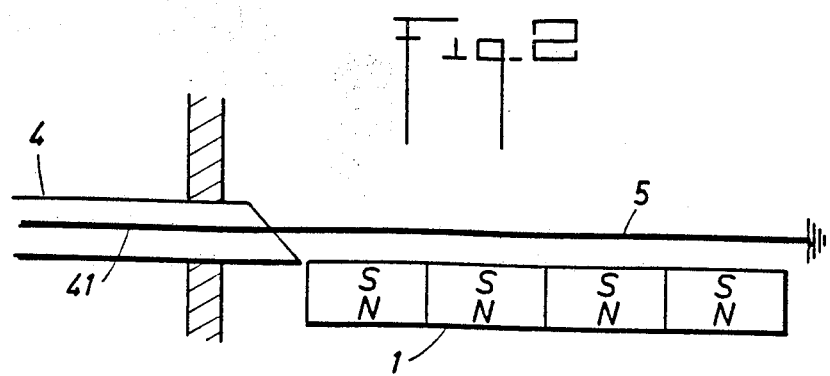
FIG. 2 is a diagrammatical sideview showing one elementary excitation device according to the invention.
Figure 3A:
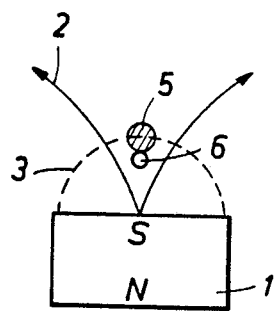
FIGS. 3a and 3b illustrate two variant embodiments of the elementary device of FIG. 2, seen in cross-section following a radial plane, FIG. 4 diagrammatically shows a radial section of a plasma-producing device assembly according to the invention and, FIG. 5 is a partly exploded perspective view of a plasma excitation device comprising a multipolar magnetic confinement cage and a localized microwave excitation antenna.
Figure 3B:
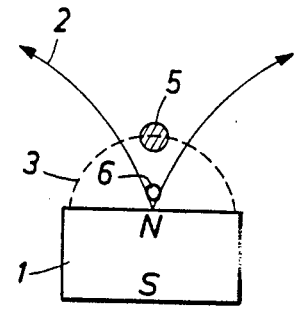

As indicated hereinabove, the microwave power must be introduced inside the mutlipolar cage 100 and the associated energy must be localized close to the resonance area. To this effect, a co-axial cable 4 or other equivalent co-axial structure, or even a waveguide is used, inside which is conveyed the microwave power. In addition, the power is injected into the resonance area by way of an antenna 5 which may be directly coupled to the waveguide, or which extends from the central core 41 of the co-axial cable 4 as indicated diagrammatically in FIG. 2. Said antenna 5 is so placed as to be situated at least close to the surface 3 in any possible arrangement with respect to the bar 1. Said antenna may also be arranged perpendicularly. One particularly efficient position which is illustrated in FIGS. 2, 3a and 3b consists in placing the antenna 5 along a magnetized bar 1, at the intersection of the median plane of said bar with the surface 3 of constant magnetic field and of intensity corresponding to the electronic cyclotronic resonance. With such an embodiment, the confinement of the electromagnetic energy between the antenna and the mass plane is improved, thus avoiding the presence of intermittent eletromagnetic fields in area 8.

The embodiments according to the invention may be varied. For example, the multipolar cage 100 may be parallelepipedal, as illustrated in FIG. 4, or cylindrical, as illustrated in FIGS. 1 and 5, or elliptic, spherical or even have other geometrical shapes. It is also possible to use one or more antennas 5. If more than one antenna is used, these antennas 5 may be either regularly distributed on the confinement surface 2, or asymmetrically distributed, their number being adapted to the maximum density of plasma to be reached.

In certain cases, the level of microwave power by volume, once the plasma has been excited, can remain a problem depending on the application proposed. It is then possible, as illustrated in FIG. 1, to interpose, between the outer area 7 of plasma excitation and the central area of use 8, a metallic screen 9 acting as a FARADAY cage. The potential of said screen 9 should be preset in order to avoid fluctuations. If the screen mesh is small compared with the length of hyperfrequency waves and high compared with the DEBYE length of the plasma, diffusion of the latter is achieved without difficulties, whereas the hyperfrequency radiation remains confined in the excitation area.

The magnetic field delivered by the permanent magnets 1 can also be increased if the magnetic circuit outside cage 100 is closed up, either with permanent magnets or else with a highly permeable material 10 such as soft iron, which may be integrated in the construction of the vacuum enclosure (see FIGS. 1 and 4). This particular precaution eliminates the antagonistic effect of the opposite pole of every magnet bar thus increasing the magnetic field close to the surface of the active pole situated opposite the area of use 8.

Permanent magnets 1 can be very sensitive to the effects of temperature. In order to prevent direct absorption of microwave energy by the magnets 1, it may be useful, if not to cool them, at least to cover them, on the side of the surface facing the antenna 5 and the plasma, with a metallic, preferably non-magnetic material. Likewise, in order to prevent a reduction of electrons in the plasma, it is possible to isolate antenna 5 by way of a dielectric, as well as the gas inlet and portion of multipolar structure 100 which is in direct contact with the plasma.

It is moreover advantageous to cool, by using a flow of fluid, the antenna 5 and the central core of the co-axial cable 4 permitting the introduction of energy into the multi-polar cage 100 and its distribution over the surface thereof. This is all the more necessary under partial vacuum, that cooling can be achieved only by conduction or exposure to radiation. Depending on the diameter of the antenna used, said cooling can be performed either by simple flow inside the antenna, or by a double flow using a co-axial structure internal to the antenna 5. The advantage of the cooling is that the injected microwave power is increased without any risks, hence increasing the density of the plasma.

Another characteristic of the present invention resides in the possiblity of introducing ionizing gas at the actual level of antenna 5. If the antenna is not cooled, it can serve directly for distributing the gas which then flows inside said antenna. If the antenna is cooled, which is generally the case, the gas distribution may be performed via another tube 6 which can be either coupled to the antenna proper (FIG. 3a) or situated in the close vicinity thereof (FIG. 3b). To obtain a regular distribution of the gases, the gas inlet tube 6 is perforated throughout its length, with multiple orifices of rather small diameters compared with the inner diameter of tube 6. With this type of gas distribution, the gas pressure is maximum at the level of the excitation, and minimum inside the central volume of the plasma.

The diagram of FIG. 4, shows in cross-section, a complete device for producing plasma using the process according to the present invention. Said device comprises a tight magnetic or non-magnetic enclosure 10, a pumping device 11 and a gas-introducing device 12 enabling the pressure of the gas to be ionized to be kept to the required value, for example around $10^{-3}$ to $10^{-1}$ Pa. The magnetic multipolar confinement structure 100 is formed of permanent magnets 1 giving, close to the structure, a magnetic field which is sufficient to obtain an electronic cyclotronic resonance, as indicated hereinabove. The microwave power supplied by a generator 13 is introduced in enclosure 10, then in the multipolar cage 100, via a co-axial cable 4 which could however be replaced by a waveguide. Tuning is achieved via an impedance adaptor 14 which may be constituted for example by a "T" hybrid. Plasma excitation is achieved in the resonance area, due to the antennas 5 distributed over at least part of the magnetic confinement surface. The resulting plasma may be characterized by a device such as a LANGMUIR probe 15. The plasma permits, in the area of use 8, a surface treatment. The sample 16 is placed on a sample carrier 17, via an introduction chamber not shown in the drawings, and polarized with respect to the potential of the plasma, owing to a generator 18. Said polarization is totally independent of the parameters of production and confinement of the plasma.

For example, it has been possible to obtain densities of $10^{11} e-$ per cm$^3$ at a frequency of 2.45 GHz and of $10^{12} e-$ per cm$^3$ at a frequency of 10.0 GHz.

And for another example, in a multipolar reactor of 15 liters serviceable volume, using permanent magnets of baryum ferrite and an excitation at 2.45 GHz, with a simple 15 cm-long antenna, it was possible to obtain a pressure of $10^{-1}$ Pa, an argon plasma of electron density $n = 3 \times 10^{10}$ cm$^3$ with an injected microwave power of 100 watts. In this case, the electronic temperature is around 18,000 K (1.6 electronvolt). With three antennas distributed over the surface, the density obtained is close to $10^{11}$ cm$^3$.

Among the noticeable advantages of the present invention, there is the possibility to increase the density of the plasma inside the multipolar confinement structure by simply increasing the surface of the microwave source, namely the length of the antenna. The plasma density can also be increased by merely increasing the microwave frequency, hence the critical density.

Another advantage lies in the absence of any other special magnetic structures, such as coils which are always expensive and cumbersome and imply a power supply and a cooling system. The absence of electromagnet coils also eliminates the need for the presence of residual intense magnetic fields in area 8.

In the case of use of a simultaneous localization of the electronic cyclotronic resonance area, of the microwave power and of the gas distribution, it is possible to obtain plasmas at very low pressure, as low as $10^{-3}$ Pa, in the middle of the confinement volume.

If the antennas are distributed over the confinement surface, the homogeneity of the plasma is improved, even at the high pressures of around $10^{-1}$ Pa where the collisions can no longer be overlooked.

In the case where co-axial cables are used, the transport of microwave energy is inexpensive and easily integratable to a machine. It also permits the production of completely closed structures of confinement.

Another fact to be noted is that the structure of the device according to the invention permits different applications. In the absence of plasma, the microwave power introduced in the reactor can permit a very efficient degassing of the inside of the enclosure 10, helping in particular the elimination of any traces of steam, which are a particular problem with fluorinated plasmas and chlorinated plasmas.

The case illustrated in FIGS. 1, 4 and 5 is that of the production of plasma and of its confinement in one closed multipolar structure. In certain applications, for which the confinement and plasma uniformity requirements are not so strict, it is possible to use an excitation device according to the invention, for example associated to a bar and antenna, such as illustrated in FIGS. 2, 3a and 3b, just for generating the plasma. The different magnets may also be placed on a nonclosed structure where the sole requirements are linked to the introduction of the plasma and not to its confinement. In this case, requirements as to the position of the magnets are not so strict and for example, a non-alternation of the magnetic poles is tolerated. Such a device is well adapted to the creation of large-sized sources of plasma, such as for example plasma tunnels, and to the production of ions.

What is claimed is:

1. A device exciting a plasma by using microwaves at the electronic cyclotronic resonance to create a central volume of plasma which is devoid of magnetic field, wherein said device comprises a vessel defining a central volume, at least one permanent magnet positioned remote from the central volume creating a surface of constant magnetic field and of intensity corresponding to the electronic cyclotronic resonance remote from the central volume, and at least one antenna joined to a co-axial structure for applying energy in the microwave range, and positioned on said surface of constant magnetic field and of intensity corresponding to the electronic cyclotronic resonance for exciting a plasma locally to the at least one permanent magnet and remote from the central volume so that the plasma is devoid of magnetic field in the central volume.

2. The device as claimed in claim 1, wherein the permanent magnet is constituted by a magnetized bar and the antenna is positioned at the intersection of the median plane of said bar with the surface having a constant magnetic field and an intensity corresponding to the electronic cyclotronic resonance.

3. The device as claimed in claim 1, wherein means are also provided for creating a flow of cooling fluid along the antenna.

4. The device as claimed in claim 1, wherein means are also provided for admitting the gas to be ionized, said means being placed proximate the antenna and being perforated with orifices distributed along said antenns.

5. The device as claimed in claim 1, wherein said co-axial structure is constituted by a co-axial cable.

6. A device for producing a homogenous, isotropic and field-free plasma of large volume and high-density, comprising: a tight enclosure connected to a pumping circuit and to a circuit for introducing a gaseous medium, the pumping circuit and gaseous medium introducing circuit being cooperative to provide a predetermined pressure inside the enclosure in a central volume thereof, a multi-polar magnetic confinement structure positioned remote from the central volume, and a device for exciting the gaseous medium by means of microwaves at the electronic cyclotronic resonance, said exciting device comprises at least one co-axial structure for introducing the microwave power inside the multipolar confinement structure and at least one antenna coupled to the co-axial structure for the localized introduction of the microwave energy, the multi-polar magnetic confinement structure comprising a set of permanent magnets creating a network of surfaces having a constant magnetic field and presenting locally an intensity which corresponds to the electronic cyclotronic resonance, and said antenna being positioned on said network of surfaces of constant magnetic field in an area of intensity correponding to the electronic cyclotronic resonance and remote from the central volume for locally creating a plasma remote from the central volume such that the created plasma is devoid of magnetic field in the central volume.

7. The device as claimed in claim 5, wherein the multipolar magnetic confinement structure is constituted by a multipolar cage formed by bars of permanent magnetic type, which bars extend in parallel and offer, in the direction of the volume defined by the confinement structure, a face of successively different polarities and the antenna is placed in parallel to a magnetic bar, at the intersection of the median plane of the bar with the surface of a constant magnetic field, of intensity corresponding to the electronic cyclotronic resonance.

8. The device as claimed in claim 6, wherein said microwave excitation device comprises a plurality of antennas distributed along the multipolar magnetic confinement structure.

9. The device as claimed in claim 6, wherein said multipolar magnetic confinement structure is placed inside the tight enclosure.

10. The device as claimed in claim 6, wherein said multipolar magnetic confinement structure, forming cage is operationally coupled to a structure ensuring the closure of the magnetic circuit outside the cage, said closing structure being provided with permanent magnets or with a highly permeable material.

11. The device as claimed in claim 10, wherein said closing structure, produced from a highly permeable material, is integrated in the tight enclosure.

12. The device as claimed in claim 8, wherein at least one tube for introducing the gas to be ionized is proximate each antenna and in parallel relation thereto, and each tube is provided with a set of orifices distributed throughout its length and having a small diameter compared with the diameter of the tube.

13. The device as claimed in claim 6, wherein means are also provided for creating inside the antenna a flow of cooling fluid or of gas to be ionized.

14. A process for exciting a plasma using microwave at the electronic cyclotronic resonance to produce in a central volume a homogenous and isotropic magnetic fields free plasma of large volume and high-density, which process comprises the steps of providing a central volume by means of a vessel, producing locally, by means of a multi-polar magnetic structure positioned remote from the central volume, a magnetic field remote from the central volume of sufficient intensity for the electronic cyclotronic resonance, and introducing the microwaves energy in localized manner, via antennas, in the zone of magnetic fields permitting an electronic cyclotronic resonance remote from the central volume to create thereby a homogenous and isotropic plasma in the central volume free from magnetic fields.

* * * * *